United States Patent
Ho et al.

(10) Patent No.: US 9,773,790 B1
(45) Date of Patent: Sep. 26, 2017

(54) SEMICONDUCTOR DEVICE AND METHOD FOR FORMING THE SAME

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Chien-Ting Ho, Taichung (TW); Li-Wei Feng, Kaohsiung (TW); Ying-Chiao Wang, Changhua County (TW); Yu-Chieh Lin, Kaohsiung (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/456,605

(22) Filed: Mar. 13, 2017

(30) Foreign Application Priority Data

Dec. 9, 2016  (CN) .......................... 2016 1 1129233

(51) Int. Cl.
| | |
|---|---|
| *H01L 27/108* | (2006.01) |
| *H01L 29/423* | (2006.01) |
| *H01L 29/45* | (2006.01) |

(52) U.S. Cl.
CPC .... *H01L 27/10823* (2013.01); *H01L 27/1087* (2013.01); *H01L 27/10829* (2013.01); *H01L 27/10867* (2013.01); *H01L 29/4236* (2013.01); *H01L 29/456* (2013.01)

(58) Field of Classification Search
CPC ......... H01L 27/10823; H01L 27/10829; H01L 27/10867; H01L 27/1087; H01L 29/4326; H01L 29/456; H01L 27/10841; H01L 27/10864
See application file for complete search history.

(56) References Cited

U.S. PATENT DOCUMENTS

| 7,476,585 B2 | 1/2009 | Cho et al. | |
|---|---|---|---|
| 2011/0068384 A1* | 3/2011 | Kim | .................... H01L 27/0207 257/302 |
| 2015/0333069 A1* | 11/2015 | Kim | .................. H01L 27/10814 257/334 |

* cited by examiner

*Primary Examiner* — Walter H Swanson
(74) *Attorney, Agent, or Firm* — Winston Hsu (57) ABSTRACT

A semiconductor device includes a substrate including at least a memory region defined therein and a plurality of memory cells formed in the memory region, a plurality of first connecting structures, a plurality of second connecting structures, a plurality of dummy nodes respectively disposed on the first connecting structures, and a plurality of first storage nodes respectively disposed on the second connecting structures. The first connecting structures respectively include a conductive portion and a first metal portion, and the second connecting structures respectively include the conductive portion and a second metal portion. The first metal portion and the second metal portion include the same material. And the first metal portion and the second metal portion include different heights.

12 Claims, 6 Drawing Sheets

SEMICONDUCTOR DEVICE AND METHOD FOR FORMING THE SAME

BACKGROUND OF THE INVENTION

1. Field of the Invention

The present invention relates to a semiconductor device and a method for forming the same, and more particularly, to a semiconductor memory device and a method for forming the same.

2. Description of the Prior Art

Dynamic random access memory (hereinafter abbreviated as DRAM) is a volatile memory that commonly used as system memory. A memory cell array of DRAM has a configuration in which memory cells, each including an access field effect transistor (FET) and a storage capacitor, are arranged in array-like manner, i.e. in row and column directions.

The storage capacitors are formed either by etching trenches in the substrate in each of the cell areas, commonly referred to as trench capacitors, or are formed over the access FETs in the cell areas by depositing and patterning conducting layers over the access transistors, and are commonly referred to as stacked capacitors. The capacitors make electrical contact to one of the two source/drain areas (node contact) of each FET, while bit lines make electrical contact to the other source/drain area of each FET. It is becoming increasingly difficult to fabricate more memory cells on a DRAM device while limiting the overall DRAM device area to a practical size without decreasing the cell area. Further, as the cell area decreases, the available area for the storage capacitor in each cell also decreases. This makes it difficult to maintain sufficient capacitance to provide the necessary signal-to-noise ratio. Also, the refresh cycle time necessary to maintain sufficient charge on these capacitors also decreases, resulting in DRAM devices with reduced performance (speed). Therefore, one method in the semiconductor industry of overcoming the above problems is to form DRAM devices having stacked capacitors. These types of capacitors extend vertically upward over the MOS transistors. The two basic types of stacked capacitor DRAM cells of the prior art are the capacitor over bit line (hereinafter abbreviated as COB) and capacitor under bit line (CUB).

As memory cells of DRAM become more integrated and miniaturized, fabrication of those elements becomes more difficult. Furthermore, DRAM includes not only the memory cells that are arranged in array-like manner in the memory region but also other logic devices that are formed in non-memory/peripheral region. Therefore the different device densities between the memory cells and the logic devices further induce process issue.

SUMMARY OF THE INVENTION

According to an aspect of the present invention, a semiconductor device is provided. The semiconductor device includes a substrate including a memory region defined therein, and a plurality of memory cells are formed in the memory region. The semiconductor device includes a plurality of first connecting structures disposed on the substrate in the memory region, a plurality of second connecting structures disposed on the substrate in the memory region and electrically connected to the memory cells, a plurality of first storage nodes respectively disposed on the second connecting structures, and a plurality of dummy nodes respectively disposed on the first connecting structures. The first connecting structures respectively include a conductive portion and a first metal portion, and the conductive portion is sandwiched between the first metal portion and the substrate. The second connecting structures respectively include the conductive portion and a second metal portion, and the conductive portion is sandwiched between the second metal portion and the substrate. The first metal portion and the second metal portion include a same material, and the first metal portion and the second metal portion include different heights.

According to an aspect of the present invention, a method for forming a semiconductor device is provided. The method for forming the semiconductor includes following steps. A substrate including at least a memory region defined therein is provided, and a plurality of memory cells are formed in the memory region. Next, an insulating layer is formed on the substrate and followed by forming a plurality of openings in the insulating layer, and the openings respectively expose a portion of the memory cells. Then, a conductive portion and a metal layer are sequentially formed in the openings. After forming the metal layer, a portion of the metal layer is removed to form a plurality of first metal portions and a plurality of second metal portions, the first metal portion and the conductive portion form a first connecting structure, and the second metal portion and the conductive portion form a second connecting structure. After forming the first connecting structures and the second connecting structures, a passivation layer is formed on the first connecting structures. Thereafter, a plurality of first storage nodes and a plurality of dummy nodes are formed on the substrate. The dummy nodes are electrically connected to the first connecting structures, and the first storage nodes are electrically connected to the second connecting structures.

According to the semiconductor device and the method for forming the same provided by the present invention, the second connecting structures electrically connected to the memory cells and the storage nodes, and the first connecting structure electrically connected to the dummy nodes are formed on the substrate in the memory region. More important, the dummy nodes and the first connecting structures are formed to increase pattern density. Therefore the process issue induced by different pattern densities is solved. Accordingly, the semiconductor device provided by the present invention includes superior performance even when DRAM become more integrated and miniaturized.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a method for forming a semiconductor device provided by a preferred embodiment of the present invention, wherein FIG. 2 is a schematic drawing in a step subsequent to FIG. 1;

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
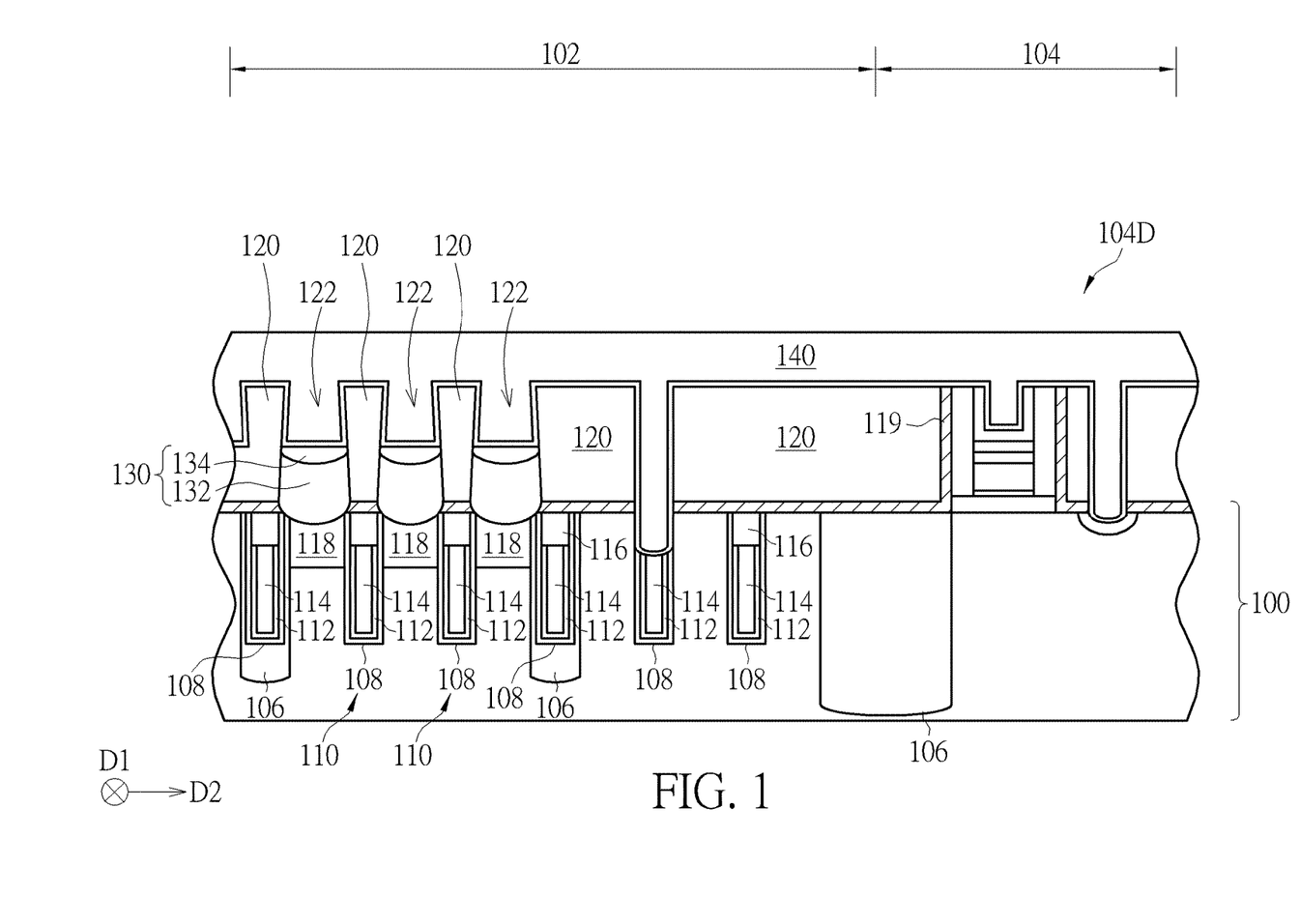

Please refer to FIGS. 1-5, which are schematic drawings illustrating a method for forming a semiconductor device provided by a preferred embodiment of the present invention. As shown in FIG. 1, the method for forming the semiconductor device provided by the preferred embodiment provides a substrate 100 including at least a memory region 102 and a peripheral region 104 defined therein, and a plurality of memory cells 110 are formed in the memory region 102. In the preferred embodiment, the memory cells 110 preferably include DRAM cells, but not limited to this.

Please refer to FIG. 1. In some embodiments of the present invention, the memory cells 110 can be formed by the following step. A plurality of shallow trench isolation (hereinafter abbreviated as STI) structures 106 are formed in the substrate 100 in the memory region 102 and the peripheral region 104. The STI structures 106 are to define regions for accommodating transistor devices and to provide electrical isolations between those devices. Next, a plurality of recesses 108 are formed in the substrate 100 and the STI structures 106 in the memory region 102. A dielectric layer 112 is then formed to cover sidewalls and bottoms of the recesses 108. Thereafter, a buried gate 114 is formed in each recess 108 and followed by forming an insulating layer 116 to seal each recess 108. Next, a source/drain region 118 is formed in the substrate 100 at two sides of the buried gates 114. It is noteworthy that the buried gates 114 are arranged along a first direction D1 and extended along a second direction D2, and the first direction D1 and the second direction D2 are perpendicular to each other. Consequently, the memory cells 110 are formed in the substrate 100 in the memory region 102. However, those skilled in the art would easily realize that the memory cells 110 can be formed by any other suitable processes, and thus steps for forming the memory cells are not limited to this. After forming the memory cells 110, transistor device(s) 104D can be formed in the peripheral region 104 and followed by forming an etch stop layer 119 on the substrate 100, as shown in FIG. 1. It should be understood that the source/drain region 118 of the memory cells 110 in the memory region 102 and source/drain region (not shown) of the transistor device 104D in the peripheral region 104 can be formed simultaneously or separately, and those details are omitted in the interest of brevity.

Please still refer to FIG. 1. After forming the memory cells 110 and the transistor device 104D, an insulating layer 120 and a plurality of bit line (hereinafter abbreviated as BL) structures (not shown) are formed on the substrate 100. The insulating layer 120 includes an insulating material such as silicon oxide (SiO), but not limited to this. The BL structures respectively can include BL contact plugs and a bit line electrically connected to the BL contact plugs. Since steps for forming the BL structures are well-known to those skilled in the art, those details are omitted in the interest of brevity.

Please still refer to FIG. 1. After forming the insulating layer 120 and the BL structures, a plurality of openings 122 are formed in the insulating layer 120. The openings 122 expose a portion of the memory cells 110, respectively. In detail, the openings 122 respectively expose regions corresponding to the source/drain region 118 of the memory cells 110. Next, the etch stop layer 119 exposed at bottoms of the openings 122 is removed and thus a portion of the source/drain region 118 of the memory cells 110 are exposed by the openings 122.

Please still refer to FIG. 1. Next, a semiconductor layer 132 and a metal silicide layer 134 are sequentially formed in the openings 122, and the semiconductor layer 132 and the metal silicide layer 134 are taken as a conductive portion 130. In some embodiments of the present invention, the semiconductor layer 132 can include an epitaxial silicon layer or an amorphous silicon layer, but not limited to this. The metal silicide layer 134 can be a reactant of a metal material and the above semiconductor layer 132. After forming the conductive portions 130, a metal layer 140 is formed on the substrate 100. Additionally, it is well-known to those skilled in the art that openings can be formed in the memory region 102 and the peripheral region 104 in required. For example, openings that exposing the source/drain region of the transistor device 104D in the peripheral region 104 or opening that exposing the buried gates 114 in the memory region 102 immediately adjacent to the peripheral region 104 can be formed, but not limited to this. In some embodiments of the present invention, polysilicon gates of the transistor devices 104D can be removed to form a gate trench. Thus, metal layer 140 is formed to fill up the openings 122 and the gate trenches in the memory region 102 and the peripheral region 104. As shown in FIG. 1, the metal layer 140 blankly covers a surface of the substrate 100. In some embodiments of the present invention, the metal layer 140 can include tungsten (W), but not limited to this. Furthermore, the metal layer 140 can be a single layer in some embodiments of the present invention, but it can be a multi-layered structure in other embodiments of the present invention. For example, in those embodiments that metal gate/replacement gate approach is adopted, the metal layer 140 can be a multi-layered structure that include at least an n-typed or p-typed work function metal layer and filling metal layer, but not limited to this.

Figure 2:
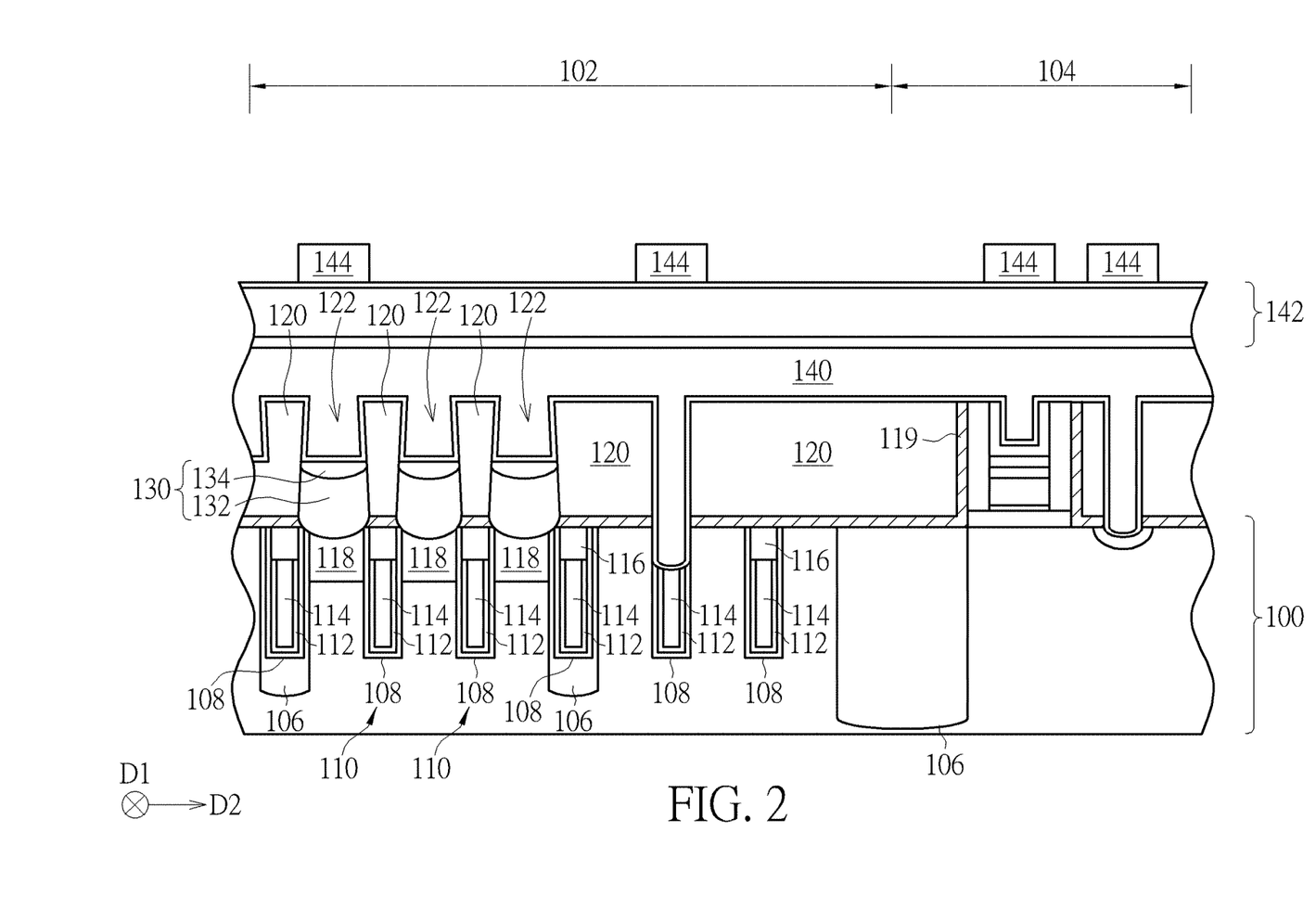

Please refer to FIG. 2. Next, a mask layer 142 and a patterned photoresist 144 are formed on the substrate 100. In some embodiments of the present invention, the mask layer 142 can be a multi-layered structure, as shown in FIG. 2, but not limited to this. It is noteworthy that the patterned photoresist 144 includes a pattern defining locations and sizes of a plurality of landing pads to be formed.

Figure 3:
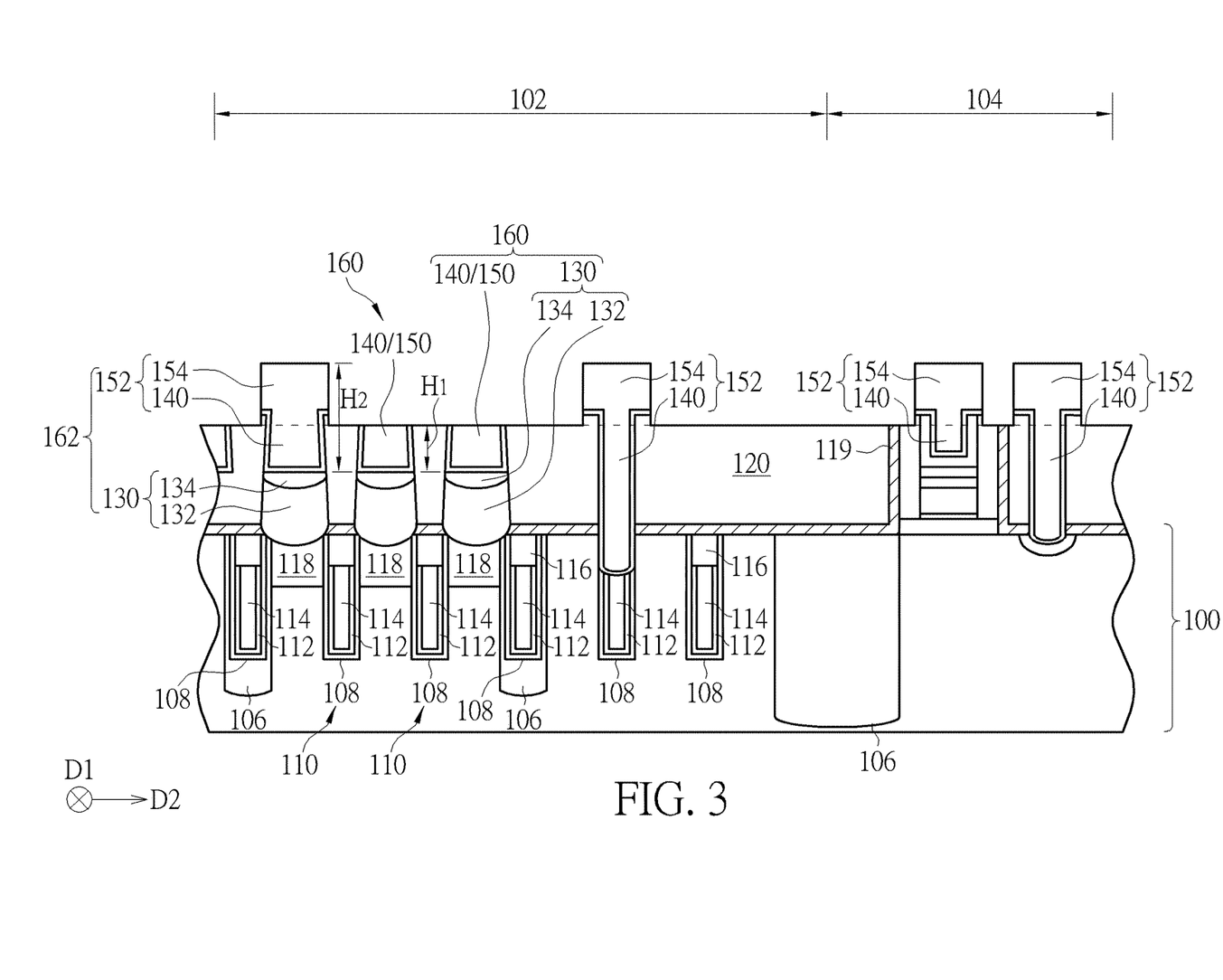
FIG. 3 is a schematic drawing in a step subsequent to FIG. 2.

Please refer to FIG. 3. Thereafter, the pattern is transferred to the mask layer 142 from the patterned photoresist 144. The metal layer 140 is then etched through the mask layer 142 and followed by removing the patterned photoresist 144 and the mask layer 142. Consequently, portions of the metal layer are removed to form a plurality of the first metal portions 150 and a plurality of second metal portions 152, as shown in FIG. 3. It is noteworthy that the first metal portions 150 are the metal layer 140 filling up the openings 122 while the second metal portions 152 are the metal layer 140 filling up the openings 122 and portion of the metal layer 140 that formed on the insulating layer 120 to serve as a landing pad 154. As shown in FIG. 3, a width of the landing pad 154 is preferably larger than a width of the openings 122. More important, in the memory region 102, the conductive portions 130 (including the semiconductor layer 132 and the metal silicide layer 134) and the first metal portions 150 forma first connecting structure 160, and the conductive portions 130 and the second metal portions 152 (including the metal layer 140 and the landing pad 154) form a second connecting structure 162 as shown in FIG. 3. The second connecting structures 162 are electrically connected to the source/drain region 118 of the memory cells 110. Furthermore, since the first metal portions 150 include the metal layer 140 filling up the openings 122 and the second metal portion 152 include the metal layer 140 formed in the openings 122 and the landing pad 154 formed on the insulating layer 120, the first metal portions 150 and the second metal portions 152 include the same material but different heights and widths: a width of a top surface of the first metal portion 150 is smaller than a width of a top surface of the second metal portion 152, and a height $H_1$ of the first metal portion 150 is smaller than a height $H_2$ of the second metal portion 152.

Figure 4:
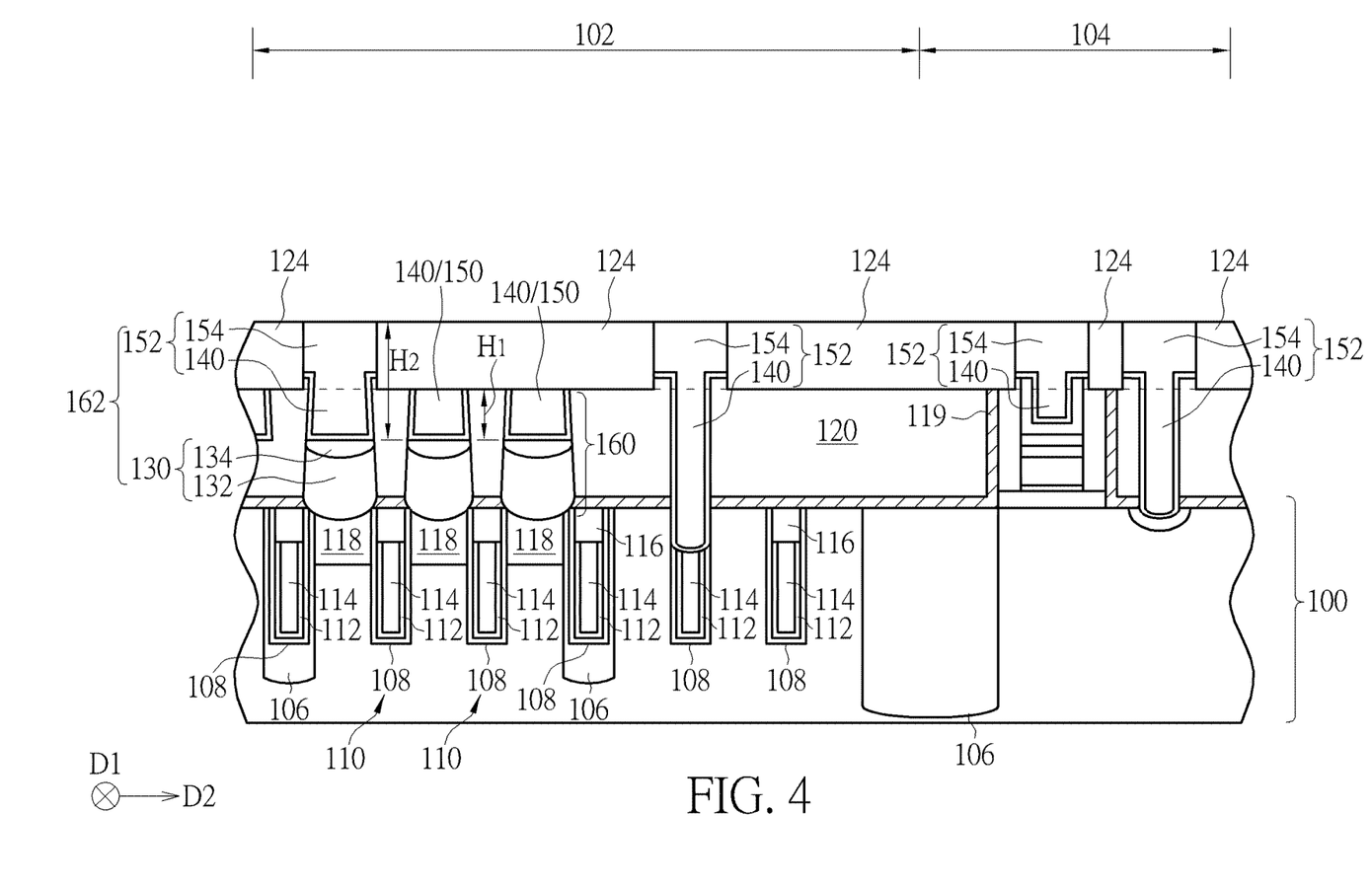
FIG. 4 is a schematic drawing in a step subsequent to FIG. 3.

Please refer to FIG. 4. After forming the first connecting structures 160 and the second connecting structures 162, a passivation layer 124 is formed on the substrate 100, and the passivation layer 124 can include an insulating material. The passivation layer 124 covers top surfaces of the first connecting structures 160 and thus a top surface of the passivation layer 124 is coplanar with top surfaces of the second connecting structures 162, as shown in FIG. 4. In other words, the substrate 100 obtains an even surface due to the formation of the passivation layer 124.

Figure 5:
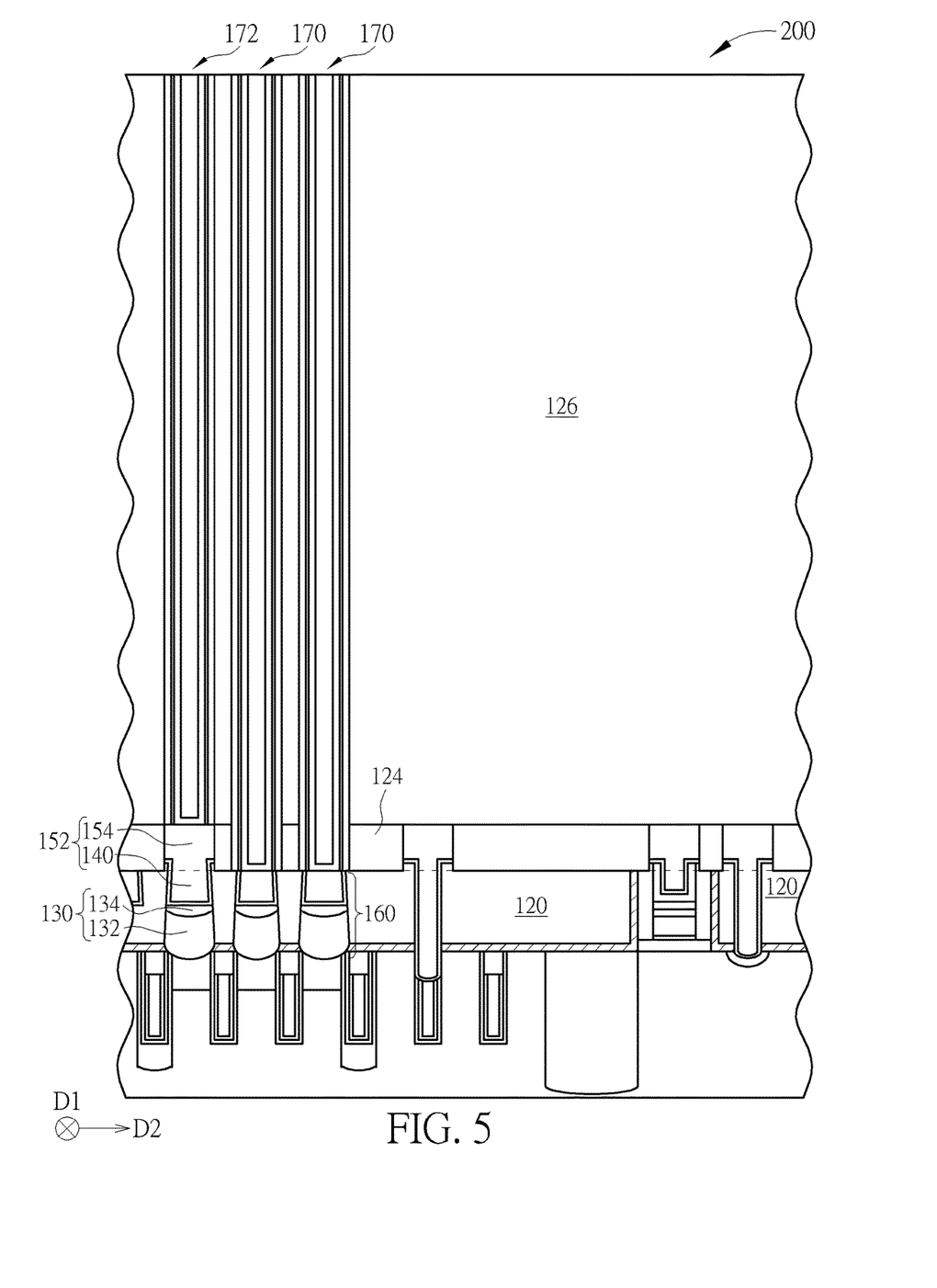
FIG. 5 is a schematic drawing in a step subsequent to FIG. 4.

Please refer to FIG. 5. Next, an insulating layer 126 and a plurality of crown-like structures are formed on the substrate 100 in the memory region 102. The crown-like structures can include a metal layer. The crown-like structures can be formed correspondingly to the first connecting structures 160 and the second connecting structures 162. It is noteworthy that the crown-like structures formed on and electrically connected to the first connecting structures 160 respectively serve as a dummy node 170 while the crown-like structures formed on and electrically connected to the second connecting structures 162 respectively serve as a storage node 172.

Please still refer to FIG. 5. Consequently, a semiconductor device 200 is provided by the preferred embodiment. The semiconductor device 200 includes the substrate 100 including the memory region 102 and the peripheral region 104 defined therein, and the memory cells 110 are formed in the memory region 102. The semiconductor device 200 further includes the first connecting structures 160 and the second connecting structures 162 formed on the substrate 100 in the memory region 102. In some embodiments of the present invention, the first connecting structures 160 are formed in between the second connecting structures 162 and the peripheral region 104. The first connecting structures 160 respectively include the conductive portion 130 (including the semiconductor layer 132 and the metal silicide layer 134) and the first metal portion 150, and the conductive portion 130 is sandwiched between the first metal portion 150 and the substrate 100. The second connecting structures 162 are electrically connected to the memory cells 110, respectively. As mentioned above, the second connecting structures 162 respectively include the conductive portion 130 and the second metal portion (including the metal layer 140 and the landing pad 154), and the conductive portion 130 is sandwiched between the second metal portion 152 and the substrate 100. The semiconductor device 200 further includes the dummy nodes 170 and the storage nodes 172, and the dummy nodes 170 are formed in between the storage nodes 172 and the peripheral region 104. As shown in FIG. 5, the dummy nodes 170 are respectively disposed on the first connecting structures 160, and physically and electrically connected to the first metal portions 150 of the first connecting structures 160. The storage nodes 172 are respectively disposed on the second connecting structures 162, and physically and electrically connected to the second metal portions 152 of the second connecting structures 162. Specifically, the storage nodes 172 are physically and electrically connected to the landing pads 154 of the second metal portions 152, respectively. As mentioned above, the height a $H_1$ of the first connecting structures 160 is smaller than the height $H_2$ of the second connecting structures 162, therefore bottom surfaces of the dummy nodes 170 disposed on the first connecting structures 160 are lower than bottom surfaces of the storage nodes 172 disposed on the second connecting structures 162, as shown in FIG. 5.

According to the semiconductor device 200 and the method for forming the same provided by the present invention, the second connecting structures 162 electrically connected to the memory cells 110 and the storage nodes 172, and the first connecting structures 160 electrically connected to the dummy nodes 170 are formed on the substrate 100 in the memory region 102. Since the first connecting structures 160 include no landing pads while the second connecting structures 162 include the landing pads 154 which occupy much more areas, more dummy nodes 170 can be formed in per unit area. Furthermore, the dummy nodes 170 and the first connecting structures 160 are formed to increase pattern density, therefore process issue induced by different pattern densities between the memory region 102 and the peripheral region 104 is solved. Accordingly, the semiconductor device 200 provided by the present invention includes superior performance even when DRAM become more integrated and miniaturized.

Figure 6:
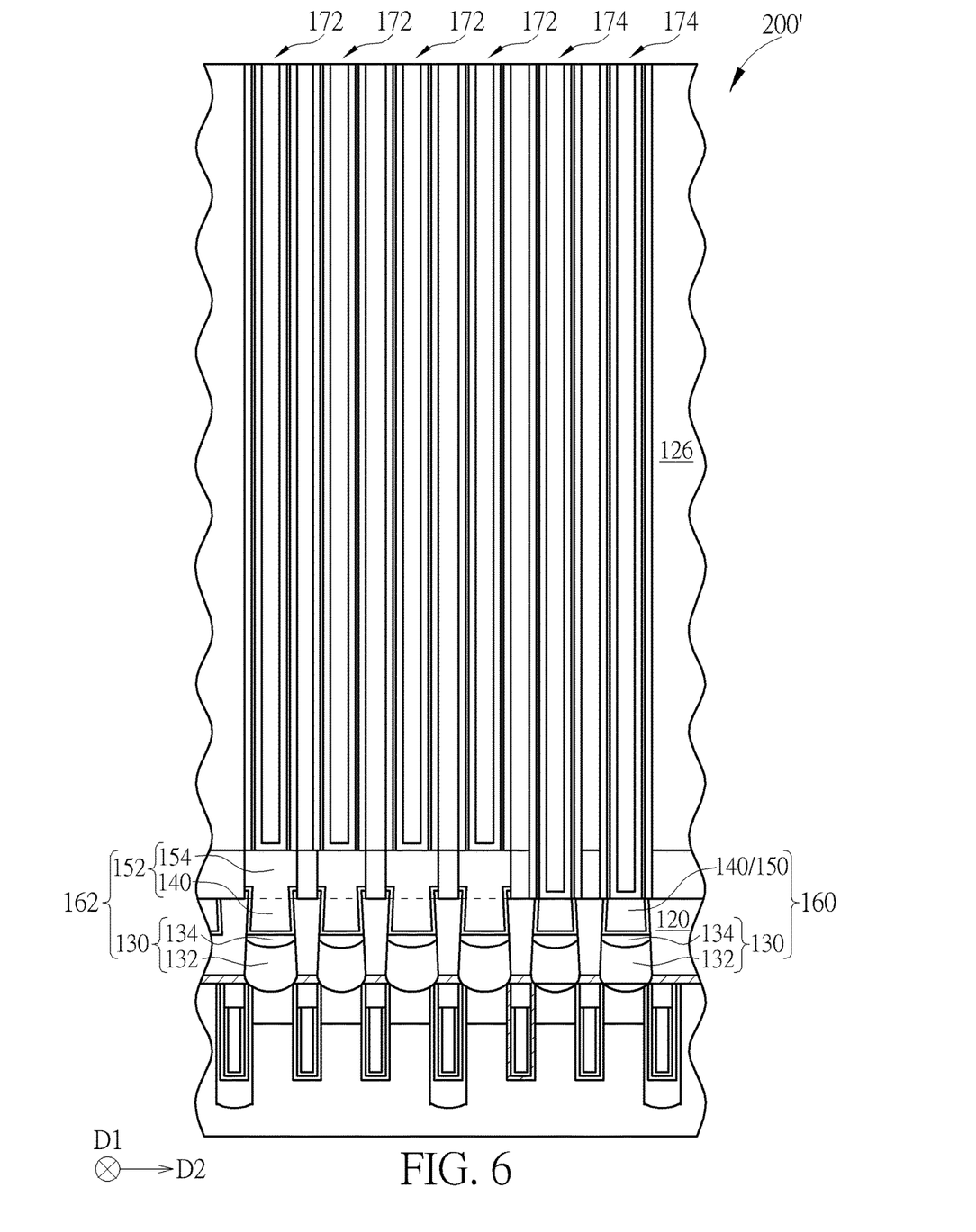
FIG. 6 is a schematic drawing illustrating a modification to the present invention.

Please refer to FIG. 6, which is a schematic drawing illustrating a modification to the present invention. It is noteworthy that elements in the modification can be formed by steps described in the abovementioned embodiment, therefore those details are omitted in the interest of brevity. Furthermore, elements the same in the modification and the abovementioned preferred embodiment can include the same material and are depicted by the same numerals. According to the modification, a semiconductor device 200' is provided. The semiconductor device 200' includes the first connecting structures 160 and the second connecting structures 162 that including constructions different from each other in the memory region 102. The semiconductor device 200' further includes the storage nodes 172 and the storage nodes 174 including depths different from each other. According to the modification, the first connecting structures 160 and the second connecting structures 162 are electrically connected to the memory cells 110, respectively. More important, the first connecting structures 160 are electrically connected to the storage nodes 174 and the second connecting structures 162 are electrically connected to the storage nodes 172. Therefore, the first connecting structures 160 and the second connecting structures 12 both provide electrical connection between the memory cells 110 and the storage nodes 172/174. Since the second connecting structures 162 include the landing pads 154 while the first connecting structures 160 include no landing pads, bottom surface of the storage nodes 174 formed on the first connecting structures 160 are lower than bottom surfaces of the storage nodes 172 formed on the second connecting structures 162.

According to the semiconductor device 200' and the method for forming the same provided by the modification, the second connecting structures 162 electrically connected to the memory cells 110 and the storage nodes 172, and the first connecting structures 160 electrically connected to the memory cells 110 and the storage nodes 174 are formed on the substrate 100 in the memory region 102. Since the first connecting structures 160 include no landing pads while the second connecting structures 162 include the landing pads 154 which occupy much more areas, more storage nodes 174 can be formed in per unit area. Thus performance of the semiconductor device 200' is further improved.

According to the semiconductor device and the method for forming the same provided by the present invention, different connecting structures are formed in the memory region. By providing the connecting structures including the landing pads, electrical connections between the storage nodes and the memory cells are constructed. And by providing the dummy nodes and the connecting structures including no landing pads, process issue due to different pattern densities is solve. Furthermore, by providing the connecting structures including no landing pads between the storage nodes and the memory cells, electrical connections between the storage nodes and the memory cells can be further constructed, and thus the performance of semiconductor device can be further improved. Accordingly, the semiconductor device provided by the present invention includes superior performance when DRAM become more integrated and miniaturized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
    a substrate comprising at least a memory region defined therein and a plurality of memory cells being formed in the memory region;
    a plurality of first connecting structures disposed on the substrate in the memory region, the first connecting structures respectively comprising a conductive portion and a first metal portion, and the conductive portion being sandwiched between the first metal portion and the substrate;
    a plurality of second connecting structures disposed on the substrate in the memory region and electrically connected to the memory cells, the second connecting structures respectively comprising the conductive portion and a second metal portion, the conductive portion being sandwiched between the second metal portion and the substrate, the first metal portion and the second metal portion comprising a same material, and the first metal portion and the second metal portion comprising different heights;
    a plurality of first storage nodes respectively disposed on the second connecting structures; and
    a plurality of dummy nodes respectively disposed on the first connecting structures.

2. The semiconductor device according to claim 1, wherein the memory cells respectively comprises a buried gate embedded in the substrate.

3. The semiconductor device according to claim 1, wherein the conductive portion comprises a semiconductor layer and a metal silicide layer.

4. The semiconductor device according to claim 3, wherein the semiconductor layer comprises an epitaxial silicon layer or an amorphous silicon layer.

5. The semiconductor device according to claim 1, wherein the second metal portion comprises a landing pad.

6. The semiconductor device according to claim 5, wherein the first storage nodes are physically and electrically connected to the landing pads of the second connecting structures.

7. The semiconductor device according to claim 1, wherein the dummy nodes are physically and electrically connected to the first metal portions of the first connecting structures.

8. The semiconductor device according to claim 1, wherein bottom surfaces of the dummy nodes are lower than bottom surfaces of the first storage nodes.

9. The semiconductor device according to claim 1, wherein the substrate comprises a peripheral region defined therein, the first connecting structures are disposed in between the peripheral region and the second connecting structures, and the dummy nodes are disposed in between the peripheral region and the first storage nodes.

10. The semiconductor device according to claim 1, further comprising a plurality of second storage nodes respectively disposed on the first connecting structures in the memory region.

11. The semiconductor device according to claim 10, wherein the first connecting structures are electrically connected to the memory cells and the second storage nodes, respectively.

12. The semiconductor device according to claim 10, wherein bottom surfaces of the second storage nodes are lower than bottom surfaces of the first storage nodes.

* * * * *